United States Patent
Chiu et al.

(10) Patent No.: US 11,456,666 B2
(45) Date of Patent: Sep. 27, 2022

(54) ZERO CURRENT DETECTION SYSTEM USED IN SWITCHING REGULATOR COMPRISING AN INDUCTOR

(71) Applicant: NUVOTON TECHNOLOGY CORPORATION, Hsinchu (TW)

(72) Inventors: Ching-Yen Chiu, Hsinchu (TW); Chung Ming Hsieh, Hsinchu Science Park (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 219 days.

(21) Appl. No.: 16/788,890

(22) Filed: Feb. 12, 2020

(65) Prior Publication Data
US 2020/0259415 A1 Aug. 13, 2020

(30) Foreign Application Priority Data
Feb. 13, 2019 (TW) ................. 108104767

(51) Int. Cl.
| | |
|---|---|
| *H02M 3/158* | (2006.01) |
| *G01R 19/175* | (2006.01) |
| *H03K 19/003* | (2006.01) |
| *H02M 7/537* | (2006.01) |
| *G01R 19/165* | (2006.01) |
| *H02M 1/00* | (2006.01) |

(52) U.S. Cl.
CPC ...... *H02M 3/158* (2013.01); *G01R 19/16533* (2013.01); *G01R 19/175* (2013.01); *H02M 7/537* (2013.01); *H03K 19/00323* (2013.01); *H02M 1/0009* (2021.05)

(58) Field of Classification Search
CPC .......... H02M 3/335–337; H02M 3/156–1588; H02M 2001/0003
See application file for complete search history.

(56) References Cited

U.S. PATENT DOCUMENTS

| | | | |
|---|---|---|---|
| 6,366,070 B1 * | 4/2002 | Cooke ................. | H02M 3/1588 323/284 |
| 6,396,252 B1 * | 5/2002 | Culpepper ............ | H02M 3/156 323/284 |

(Continued)

FOREIGN PATENT DOCUMENTS

WO    WO-2017143884 A1 *  8/2017  ............ H02M 3/158

*Primary Examiner* — Thienvu V Tran
*Assistant Examiner* — Nusrat Quddus
(74) *Attorney, Agent, or Firm* — Muncy, Geissler, Olds & Lowe, P.C.

(57) ABSTRACT

A zero current detection system for a switching regulator is provided. The switching includes an inductor. In the zero current detection system, a comparator has a positive input coupled to a terminal of the inductor and an output terminal for outputting a comparison result signal; a first signal latch circuit has a clock terminal for receiving the comparison result signal and outputting a latched output signal; a delay line module starts counting upon receipt of the latched output signal, and then outputs a zero current detection signal after counting a delay time; in response to the zero current detection signal, a voltage sampling module samples a node voltage at two different time points, to generate two sampling voltages; a delay control module adjusts the delay time of the delay line module according to the two sampling voltages.

10 Claims, 9 Drawing Sheets

(56) References Cited

U.S. PATENT DOCUMENTS

| | | | | |
|---|---|---|---|---|
| 7,800,928 B1* | 9/2010 | Dernovsek | ............ | H02M 7/523 363/132 |
| 9,444,441 B2* | 9/2016 | Hou | .................... | H02M 3/1588 |
| 9,543,829 B2* | 1/2017 | Choi | .................... | H02M 3/157 |
| 9,742,302 B2* | 8/2017 | Xue | .................... | G01R 19/175 |
| 10,116,211 B2* | 10/2018 | Chen | .................... | H02M 3/1588 |
| 10,763,738 B1* | 9/2020 | Dharmalinggam | ... | H02M 1/083 |
| 2007/0080674 A1* | 4/2007 | Gray | .................... | H02M 3/1588 323/282 |
| 2008/0246455 A1* | 10/2008 | Chu | .................... | H02M 3/1588 323/283 |
| 2008/0298106 A1* | 12/2008 | Tateishi | .............. | H02M 3/1588 363/127 |
| 2009/0295350 A1* | 12/2009 | Yamada | .............. | H02M 3/1588 323/282 |
| 2011/0001460 A1* | 1/2011 | Buthker | .............. | H02M 3/1588 323/283 |
| 2011/0148377 A1* | 6/2011 | Schiff | ................. | H02M 3/1588 323/283 |
| 2011/0267015 A1* | 11/2011 | Lu | ...................... | H02M 3/1588 323/235 |
| 2011/0291632 A1* | 12/2011 | Yu | ........................ | H02M 3/158 323/283 |
| 2012/0032728 A1* | 2/2012 | Coleman | ................ | H02M 3/158 327/434 |
| 2013/0207625 A1* | 8/2013 | Futamura | .............. | H02M 3/158 323/283 |
| 2013/0300400 A1* | 11/2013 | Zhou | .................... | G01R 19/175 324/76.71 |
| 2014/0300329 A1* | 10/2014 | Thompson | ............ | H02M 3/156 323/235 |
| 2014/0320104 A1* | 10/2014 | Guo | ....................... | H02M 3/158 323/290 |
| 2015/0091536 A1* | 4/2015 | Tanaka | .................. | H02M 3/156 323/235 |
| 2015/0102793 A1* | 4/2015 | Chen | .................... | H02M 3/1588 323/282 |
| 2015/0311795 A1* | 10/2015 | Yang | .................... | H02M 3/156 323/271 |
| 2016/0065062 A1* | 3/2016 | Teh | ....................... | H02M 3/157 323/283 |
| 2016/0233768 A1* | 8/2016 | de Cremoux | ....... | H02M 3/1588 |
| 2016/0308441 A1* | 10/2016 | Chen | .................... | H02M 3/158 |
| 2017/0187283 A1* | 6/2017 | Vaidya | ................. | H03K 17/133 |
| 2018/0191249 A1* | 7/2018 | Su | ........................ | H02M 3/1588 |
| 2019/0229607 A1* | 7/2019 | Kim | ....................... | H02M 1/38 |

* cited by examiner

ZERO CURRENT DETECTION SYSTEM USED IN SWITCHING REGULATOR COMPRISING AN INDUCTOR

CROSS-REFERENCE TO RELATED APPLICATION

This application claims the benefit of Taiwan Patent Application No. 108104767, filed on Feb. 13, 2019, in the Taiwan Intellectual Property Office, the disclosure of which is incorporated herein in its entirety by reference.

BACKGROUND OF THE INVENTION

1. Field of the Invention

The present invention relates to a zero current detection system, and more particularly to a zero current detection system capable of dynamically adjusting a delay time for detection.

2. Description of the Related Art

Generally, a switching regulator needs to detect an occurrence time instant of a zero inductor current, for switching an operational state thereof. The accuracy of the zero inductor current affects the efficiency of the switched-type regulator. However, a conventional zero current detection method using single comparator to detect zero inductor current has poor accuracy in detecting occurrence time instant of the zero inductor current. A first cause is that an input pair of the comparator has an input offset voltage due to component mismatch, so the conventional zero current detection method cannot detect the zero current point accurately. The second cause is that when current of an inductor approaches zero, a voltage on a terminal of the inductor is also approaching to zero, and a low-side power transistor is designed with low on-resistance for reducing conduction loss, for example, in a condition that the low-side power transistor has the on-resistance of 1 ohm, when the inductor current is 1 mA only, the voltage on the terminal of the inductor is 1 mV only, and it is very difficult for the comparator to accurately detect the time instant of the zero current. Therefore, it is not easy to use the comparator only to accurately detect the time instant of zero current.

SUMMARY OF THE INVENTION

An objective of the present invention is to provide a zero current detection system for adaptively detecting a time instant of zero inductor current of a switching regulator, so as to improve the efficiency of the switching regulator and solve above-mentioned problems.

In order to achieve the objective, the present invention provides a zero current detection system applicable to a switching regulator comprising an inductor, and the inductor has a terminal coupled to an output terminal of the switching regulator. The zero current detection system includes a comparator, a first signal latch circuit, a delay line module, a voltage sampling module, and a delay control module. The comparator has a positive input coupled to other terminal of the inducer opposite to the output terminal of the switching regulator, and a negative input coupled to a low voltage terminal, and an output terminal configured to output a comparison result signal. The first signal latch circuit has a clock terminal configured to receive the comparison result signal, and an output terminal configured to output a latched output signal. The delay line module is configured to start counting time according to the latched output signal, and output a zero current detection signal after counting a delay time. The voltage sampling module is configured to sample in response to the zero current detection signal, the node voltage at different time points, to generate two sampling voltages. The delay control module is configured to adjust a delay time of the delay line module according to the sampling voltage.

In an embodiment, the delay line module comprises a plurality of delay units and a plurality of switches, the plurality of delay units are connected in series, each of the plurality of switches has an terminal electrically connected to an output terminal of the delay line module, and the other terminal electrically connected to an output terminal of one of the plurality of delay units corresponding thereto, and the delay control module control the plurality of switches to turn on a different number of the delay units, so as to adjust the delay time of the delay line module.

In an embodiment, the delay control module comprises a shift register, the delay control module turns on one of the plurality of switches according to the sampling voltage, the shift register determines whether to turn off a current turned-on switch and turn on one of the plurality of switches previous to or next to the current turned-on switch.

In an embodiment, when the shift register turns on one of the plurality of switches previous to the current turned-on switch, the delay time of the delay line module is decreased, and when the shift register turns on one of the plurality of switches next to the current turned-on switch, the delay time of the delay line module is increased.

In an embodiment, when the two sampling voltages are at a low voltage level, the delay control module controls the delay line module to increase the delay time, and when the two sampling voltages are at a high voltage level, the delay control module controls the delay line module to decrease the delay time.

In an embodiment, when the first sampling voltage of the two sampling voltages is at a low voltage level, and the second sampling voltage of the two sampling voltages is at a high voltage level, the delay control module keeps the delay time of the delay line module.

In an embodiment, the delay control module comprises a look-up table recording a corresponding relationship between the two sampling voltages and adjustment of the delay time.

In an embodiment, the comparator comprises an offset voltage, and the low voltage terminal is ground, when a sum of the node voltage and the offset voltage is higher than zero voltage, the comparison result signal is changed to a high voltage level.

In an embodiment, the switching regulator comprises a first operation phase, a second operation phase and a third operation phase, and in the first operation phase, an inductor current flowing from the inductor to the output terminal of the switching regulator is increased, in the second operation phase, the inductor current is decreased, the zero current detection signal is used to control the switching regulator to enter the third operation phase.

In an embodiment, the voltage sampling module comprise a trigger, a first delay element, a second delay element, a fourth signal latch circuit and a fifth signal latch circuit, the trigger receives the node voltage, data terminals of the fourth signal latch circuit and the fifth signal latch circuit receive an output signal of the trigger, the first delay element receives an enable signal, the second delay element is electrically connected to an output terminal of the first delay element, clock terminals of the fourth signal latch circuit and the fifth signal latch circuit are electrically connected to output terminals of the first delay element and the second delay element, respectively, the output terminals of the fourth signal latch circuit and the fifth signal latch circuit output the two sampling voltages, respectively.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
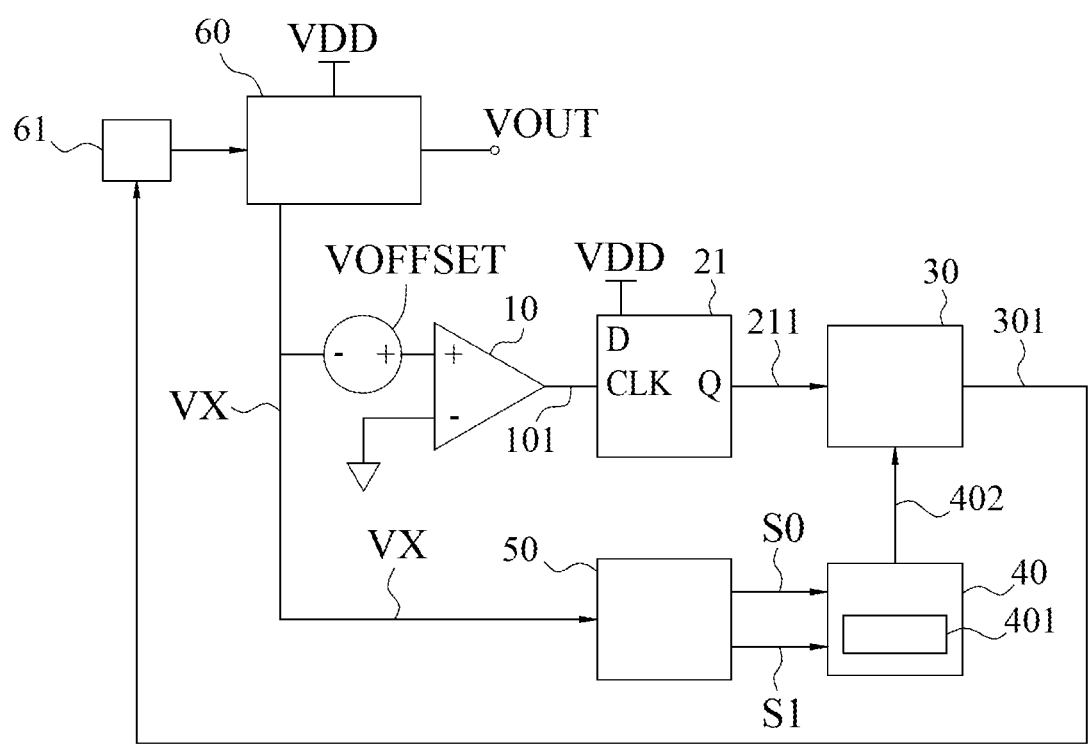
FIG. 1 is a block diagram of a zero current detection system of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third' and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Please refer to FIG. 1, which is a block diagram of a zero current detection system of the present invention. As shown in FIG. 1, the zero current detection system of the present invention is applicable to a switching regulator 60, and the switching regulator 60 can comprise an inductor L having a terminal electrically connected to an output terminal of the switching regulator 60. The switching regulator 60 usually has three operation phases. In a first operation phase P1, an inductor current flowing through the inductor L is increased, and when the inductor current is higher than a preset current threshold value, the switching regulator 60 enters a second operation phase P2. In the second operation phase P2, the inductor current flowing through the inductor L is decreased, and when the inductor current is decreased to zero, the switching regulator 60 enters a third operation phase P3. Ideally, in the third operation phase P3, the switching regulator 60 keeps the inductor current as a zero current, and then is triggered to enter the first operation phase P1 upon receipt of next trigger signal. The zero current detection system of the present invention is used to detect the time instant where the inductor current is decreased to zero in the second operation phase P2, so as to accurately control the switching regulator 60 to enter the third operation phase P3. The time instant where the inductor current is decreased to zero in the second operation phase P2 is also called zero current point herein. An inaccurate zero current point possibly reduces the efficiency of the switching regulator 60.

The zero current detection system can comprise a comparator 10, a first signal latch circuit 21, a delay line module 30, a delay control module 40 and a voltage sampling module 50. The comparator 10 has a positive input configured to receive the node voltage VX on the terminal of the inductor, and a negative input connected to a low voltage terminal, for example, in an embodiment, the low voltage terminal can be ground. The output terminal Q can output a comparison result signal 101. Ideally, when the node voltage VX becomes zero, it indicates that the inductor current IL becomes zero; however, in an actual condition, an offset voltage VOFFSET, hysteresis effect and component mismatch of the comparator 10 affects the comparison result indicating whether the node voltage VX becomes zero.

Therefore, the zero current detection system is provided with the first signal latch circuit 21, the delay line module 30, the delay control module 40 and the voltage sampling module 50, to improve the accuracy of the zero current detection.

In an actual application, the comparator 10 has the offset voltage VOFFSET, as shown in FIG. 1, the positive input of the comparator 10 is connected to a component of the offset voltage VOFFSET, and the negative input of the comparator 10 is grounded, and it indicates that when the node voltage VX plus the offset voltage VOFFSET is higher than zero, the comparison result signal 101 is changed to a high voltage level; otherwise, the comparison result signal 101 is at a low voltage level.

The first signal latch circuit 21 can comprise a clock terminal CLK configured to receive the comparison result signal 101, an output terminal Q configured to output a first latched output signal 211, and a data terminal D electrically connected to a power supply terminal. The power supply voltage of the power supply terminal is labelled as VDD. The first signal latch circuit 21 can provide the signal latch function. When the clock terminal CLK is changed to the high voltage level from the low voltage level, the signal of the output terminal Q is equal to that of the data terminal D. Since the voltage on the data terminal D is the power supply voltage VDD, which is high voltage level, when the comparison result signal 101 is changed to the high voltage level from the low voltage level, the voltage on the output terminal Q is equal to the power supply voltage VDD and at the high voltage level.

In an embodiment, the first signal latch circuit 21 can has a reset terminal, and when the reset terminal is triggered, the voltage on the output terminal Q is changed to the low voltage level. In an embodiment, when oscillation occurs on the node voltage VX, the first signal latch circuit 21 can prevent the delay line module 30 from being affected, thereby improving stability of the zero current detection system.

The delay line module 30 starts to counting time upon receipt of the first latched output signal 211, and outputs a zero current detection signal ZCD after counting for a delay time DD1. In an embodiment, the zero current detection signal ZCD can be used to control the switching regulator 60 to enter the third operation phase P3. For example, a switch control unit 61 can receive the zero current detection signal ZCD, and then control the switching regulator 60 to enter the third operation phase P3 according to the zero current detection signal ZCD.

In the third operation phase P3, the voltage sampling module 50 can sample the node voltage VX at different sampling time points ST1 and ST2, to generate two sampling voltages S0 and S1. It should be noted that the sampling voltages S0 and S1 are not limited to analog voltages or digital voltages, and can also be logic signals such as low voltage-level signal "0" or high voltage-level signal "1". In other words, upon demand, the voltage sampling module 50 can generate two sampling analog or digital voltages S0 and S1, or the two sampling voltage logic signals S0 and S1.

The delay control module 40 can adjust a delay time DD1 of the delay line module 30 according to two sampling voltages S0 and S1. When the delay control module 40 determines, according to two sampling voltages S0 and S1, that a detected time instant of the zero current detection signal ZCD is earlier than the real zero current point, the delay control module 40 can increase the delay time DD1 of the delay line module 30; when the delay control module 40 determines, according to two sampling voltages S0 and S1, that the detected time instant of the zero current detection signal ZCD is later than the real zero current point, the delay control module 40 can reduce the delay time DD1 of the delay line module 30; when the delay control module 40 determines, according to two sampling voltages S0 and S1, that the detected time instant of the zero current detection signal ZCD approaches the real zero current point, the delay control module 40 can keep the delay time DD1 of the delay line module 30.

In an embodiment, the delay control module 40 can comprise a look-up table 401 which records a corresponding relationship between the two sampling voltages S0 and S1 and the control of the delay time DD1.

Figure 2:
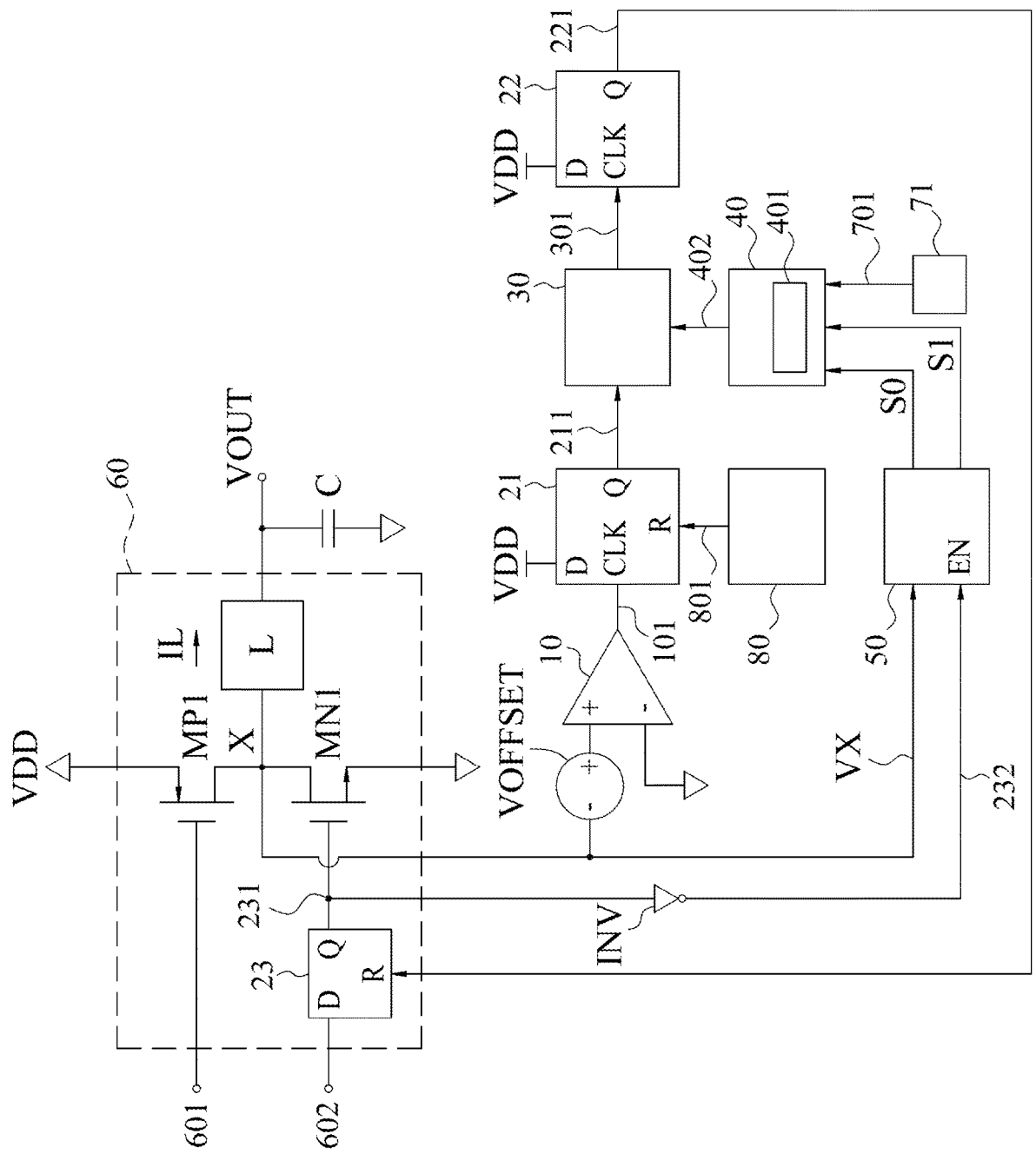
FIG. 2 is a block diagram of an embodiment of a zero current detection system of the present invention.
Figure 3:
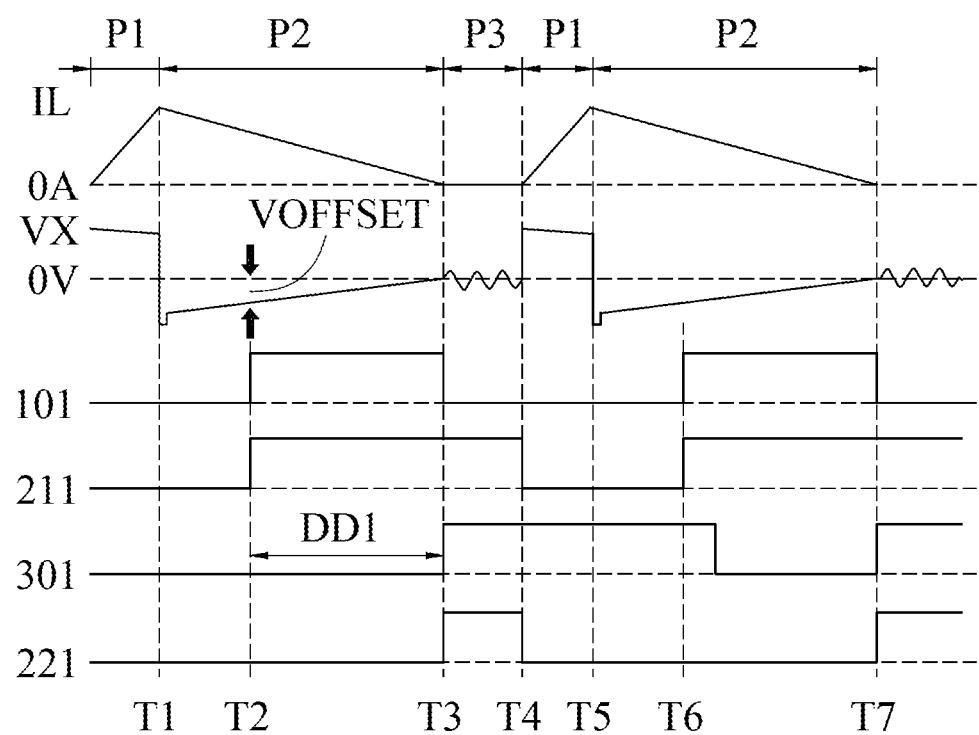
FIG. 3 is a schematic waveform view of signals of an embodiment of a zero current detection system of the present invention.

Please refer to FIGS. 2 and 3, which show a block diagram of an embodiment of a zero current detection system of the present invention, and a schematic waveform diagram of signals of an embodiment of a zero current detection system of the present invention. As shown in FIG. 2, the switching regulator 60 can comprise a first switch MP1, a second switch MN1, and an inductor L. the first switch MP1 and the second switch MN1 are serially connected, in a sequential order, between the power supply terminal and ground. The first switch MP1 is coupled between the power supply terminal and a node X, and the second switch MN1 is coupled between the node X and ground. The inductor L has a terminal electrically connected to the node X, and other terminal serving as an output terminal of the switching regulator 60 and coupled to a capacitor C. The voltage on the output terminal of the switching regulator 60 is the output voltage VOUT.

In the embodiment, the power supply terminal can provide the power supply voltage VDD, the first switch MP1 is a PMOSFET, the second switch MN1 is a NMOSFET, but the inventive concept of the present invention is not limit thereto. The first switch MP1 has a source coupled to the power supply terminal, and a drain coupled to the node X. The second switch MN1 has a source grounded and a drain coupled to the node X. The gate of the first switch MP1 and second switch MN1 can receive a control signal for controlling operation states of the first switch MP1 and the second switch MN1.

In the embodiment, the zero current detection system can comprise a second signal latch circuit 22, a reset module 80 and an inverter INV. The second signal latch circuit 22 has a clock terminal CLK for receiving the zero current detection signal ZCD, a data terminal D for receiving the power supply voltage VDD, and an output terminal Q2 outputting the zero current detection signal ZCD. A reset terminal R of the first signal latch circuit 21 can receive the reset signal 801 outputted from the reset module 80.

The switching regulator 60 can comprise a third signal latch circuit 23 which has a reset terminal R for receiving the zero current detection signal ZCD and an output terminal Q coupled to the second switch MN1. When the zero current detection signal ZCD is changed to the high voltage level from the low voltage level, the voltage on the output terminal Q of the third signal latch circuit 23 is changed to the low voltage level, such as 0V, so that the second switch MN1 is turned off and the switching regulator 60 enters the third operational state.

In an operation mode, the input terminal of the inverter INV is coupled to the control terminal of the second switch MN1, such as the gate of the NMOS, and the output terminal of the inverter INV is coupled to an enable terminal EN of the voltage sampling module 50. When the NMOS is turned off upon the low-voltage-level signal received by the gate thereof, the output terminal of the inverter INV can output the enable signal 232 with the high voltage level to the enable terminal EN of the voltage sampling module 50, so as to activate the voltage sampling module 50.

A detail operation of the zero current detection system of the present invention is described with reference to of FIGS. 2 and 3. As shown in FIGS. 2 and 3, the switching regulator 60 can comprise the first operation phase P1, the second operation phase P2 and the third operation phase P3. In the first operation phase, the first switch control signal 601 and the second switch control signal 602 are at the low voltage level, so that the first switch MP1 is turned on and the second switch MN1 is turned off, the terminal of the inductor is electrically connected to the power supply terminal which provides the inductor current IL. As shown in FIG. 3, in the first operation phase, the inductor current IL and the node voltage VX are positive values.

When the inductor current IL exceeds a preset current threshold, the switching regulator 60 enters the second operation phase P2 at a time point T1 shown in FIG. 3. In the second operation phase P2, the first switch control signal 601 and the second switch control signal 602 are at the high voltage level, the first switch MP1 is turned off and the second switch MN1 is turned on, and the terminal of the inductor L is grounded. Since the inductor current IL must be kept continuous according to electrical characteristics of the inductor L, the inductor current IL keeps flowing from ground to the inductor L after the terminal of the inductor L is grounded, it causes the node voltage VX to be lower than 0V. As shown in FIG. 2, when the switching regulator 60 enters the second operation phase P2 from the first operation phase P1, the node voltage VX is changed from a positive value to a negative value at the time point T1.

In the second operation phase P2, the inductor current IL gradually decreases and the node voltage VX gradually rises, and when a sum of the node voltage VX and the offset voltage VOFFSET of the comparator 10 is higher than 0 V, the comparison result signal 101 is changed to the high voltage level from the low voltage level, and at the same time, the first latched output signal 211 is also changed from the low voltage level to the high voltage level, at a time point T2 shown in FIG. 3.

After a delay time DD1 from the time point T2, the delay line module 30 outputs the first latched output signal 211, which is changed to the high voltage level from the low voltage level, through the output terminal thereof at a time point T3, and at the same time, the second latched output signal 221 is also changed from the low voltage level to the high voltage level, to trigger the third signal latch circuit 23 to reset, so that the third latched output signal 231 is changed to the low voltage-level signal to turn off the second switch MN1, as a result, the switching regulator 60 enters the third operation phase P3.

In the third operation phase, the first switch MP1 is turned off and the second switch MN1 is turned off, and at the same time, the enable signal 232 is at the high voltage level, so that the voltage sampling module 50 starts to sample the node voltage VX at different sample time points ST1 and ST2, to generate the two sampling voltages S0 and S1. Oscillation occurs on the node voltage VX after the second switch MN1 turn off, as shown in FIG. 3, so the delay control module 40 can adjust the delay time DD1 of the delay line module 30 according to voltage levels of the two sampling voltages S0 and S1.

Please refer to FIGS. 4 to 8, which show a schematic view of an embodiment of a voltage sampling module of a zero current detection system of the present invention, a schematic view of a voltage sampling signal of a zero current detection system of the present invention, and a schematic view of determining operation between the zero current detection signal and the zero current point, according to the zero current detection system of the present invention.

Figure 4:
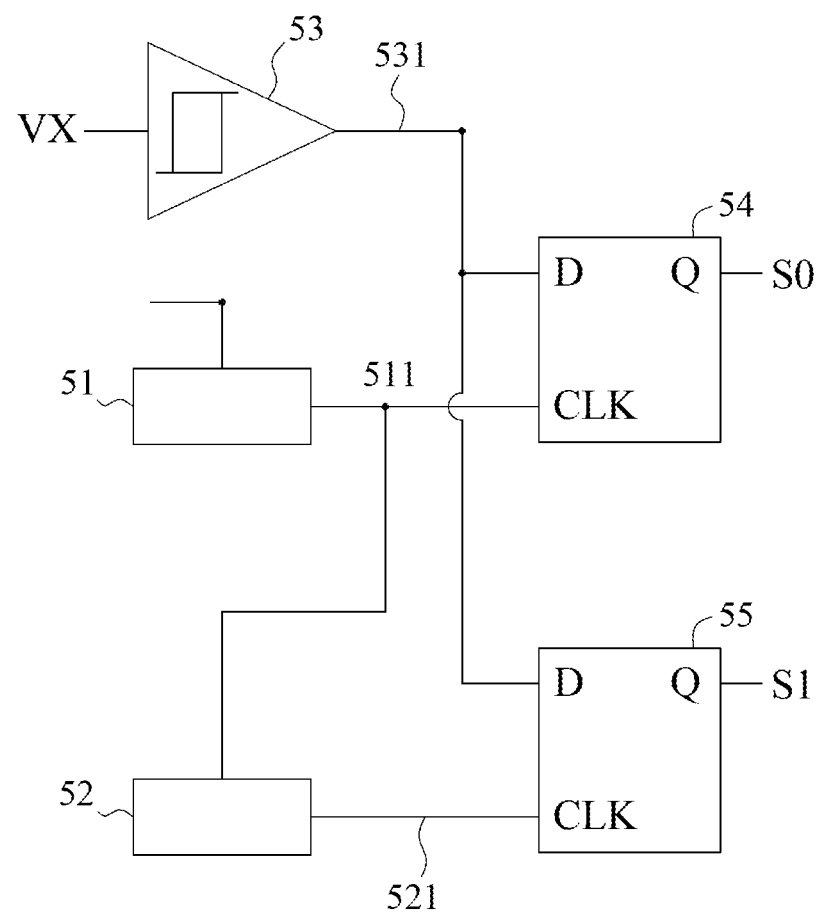
FIG. 4 is a schematic view of an embodiment of a voltage sampling module of a zero current detection system of the present invention.

In an embodiment, as shown in FIG. 4, the voltage sampling module 50 can comprise a trigger 53, a first delay element 51, a second delay element 52, a fourth signal latch circuit 54 and a fifth signal latch circuit 55. The trigger 53 receives the node voltage VX, and when the node voltage VX is higher than the preset voltage threshold, the trigger 53 outputs a high voltage-level signal. Preferably, the trigger 53 can be a Schmitt trigger, and when the node voltage VX is higher than a forward threshold voltage of the Schmitt trigger, the Schmitt trigger outputs the high voltage-level signal, and when the node voltage VX is lower than a reverse threshold voltage of the Schmitt trigger, the Schmitt trigger outputs the low voltage-level signal, and when the node voltage VX is between the forward and reverse threshold voltages, the output of the Schmitt trigger does not change.

The data terminals D of the fourth signal latch circuit 54 and the fifth signal latch circuit 55 can receive the output signal 531 of the trigger 53. The first delay element 51 can receive the enable signal 232, the second delay element 52 is electrically connected to the output terminal of the first delay element 51, clock terminals CLK of the fourth signal latch circuit 54 and the fifth signal latch circuit 55 are electrically connected to the output terminals of the first delay element 51 and the second delay element 52, respectively. The output terminals Q of the fourth signal latch circuit 54 and the fifth signal latch circuit 55 can output the two sampling voltage logic signals S0 and S1, respectively. It should be noted that the sampling voltage logic signals S0 and S1 are logic states of the sampling voltages S0 and S1 herein.

When the enable signal 232 is changed to the high voltage level from the low voltage level, it indicates that the switching regulator enters the third operation phase, so the voltage sampling module 50 starts to sample the logic state of the node voltage VX at two different time points. When the first delay element 51 receives the enable signal 232, the output signal 511 of the first delay element 51 is changed from the low voltage level to the high voltage level at the time point ST1 after a delay time D1. Next, the second delay element 52 receives the output signal 511, and after a delay time D2, the output signal 521 of the second delay element 52 is changed from the low voltage level to the high voltage level at a time point ST2.

The output signal 511 and the output signal 521 are inputted into the clock terminals CLK of the fourth signal latch circuit 54 and the fifth signal latch circuit 55, respectively, and when the output signal 511 is changed to the high voltage level from the low voltage level at the time point ST1, the fourth signal latch circuit 54 transmits the signal of the data terminal D to the output terminal Q, so as to generate the first sampling voltage logic signal S0. Similarly, when the output signal 521 is changed to the high voltage level from the low voltage level at the time point ST2, the fifth signal latch circuit 55 transmits the signal of the data terminal D to the output terminal Q, so as to generate the second sampling voltage logic signal S1; in other words, the first sampling voltage logic signal S0 and second sampling voltage logic signal S1 are generated at the time points ST1 and ST2, respectively.

Figure 5:
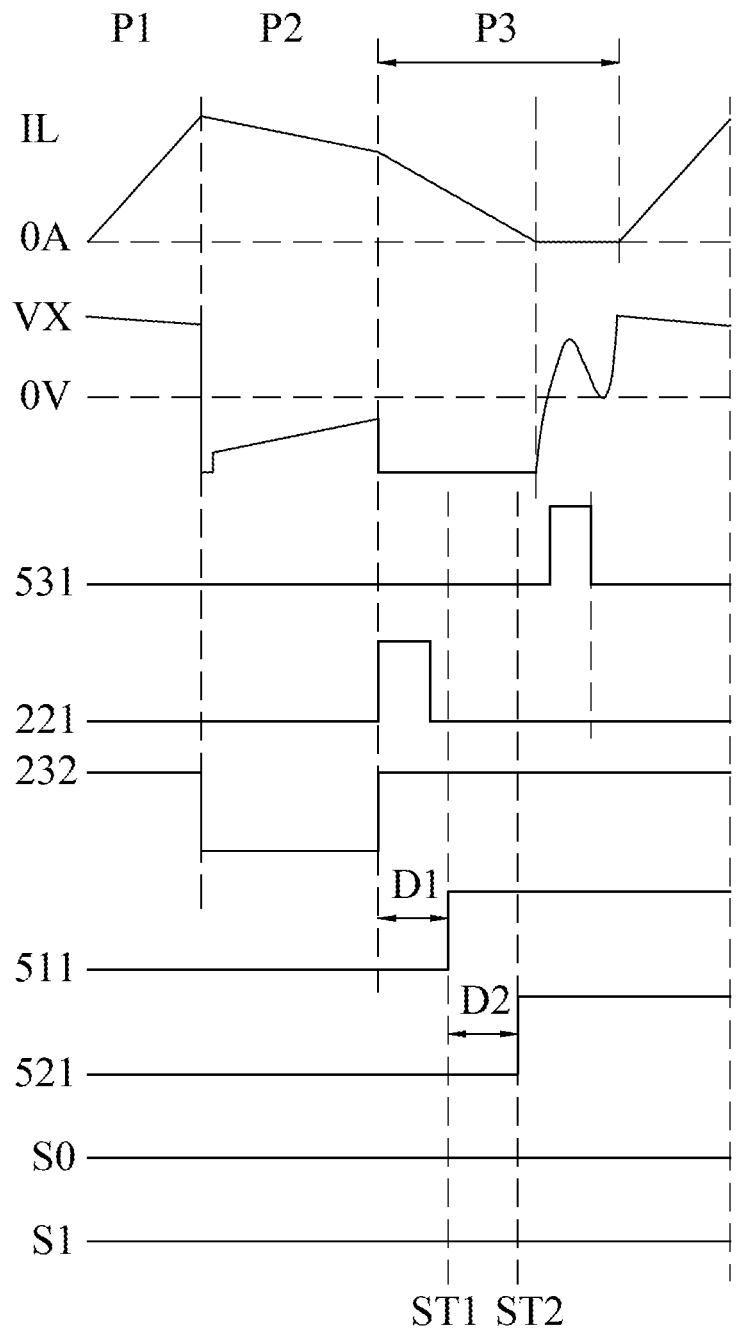
FIG. 5 is a schematic view of a voltage sampling signal of a zero current detection system of the present invention.
Figure 6:
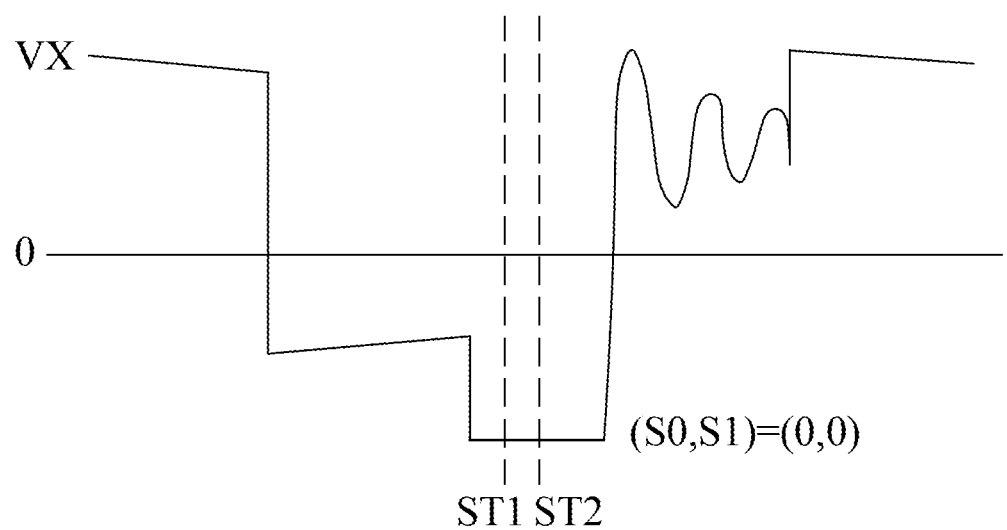
FIG. 6 is a schematic view of a zero current detection signal of a zero current detection system occurring too early, according to the present invention.

As shown in FIG. 5, which shows waveforms of signals related to a condition that the zero current detection signal is generated too early. In a condition that the zero current detection signal 221 is generated earlier than the real zero current point, the second switch MN1 is turned off, but the inductor current IL is still positive, it causes a parasitic diode of the second switch MN1 to be turned on, so that the voltage on the VX point is kept at the turn-on voltage of the parasitic diode, and the inductor current IL gradually reduces. As a result, in the condition that the zero current detection signal 221 is generated earlier than the real zero current point, after the zero current detection signal 221 is generated, the node voltage VX is kept as negative voltage until the inductor current IL is zero, so that the two sampling voltage logic signals S0 and S1 sampled at the time points ST1 and ST2 are at the low voltage level, and the logic states are (0, 0) which indicates that the zero current detection signal 221 is too early, and the delay control module 40 can control the delay line module 30 to increase the delay time DD1, as shown in FIG. 6.

Figure 7:
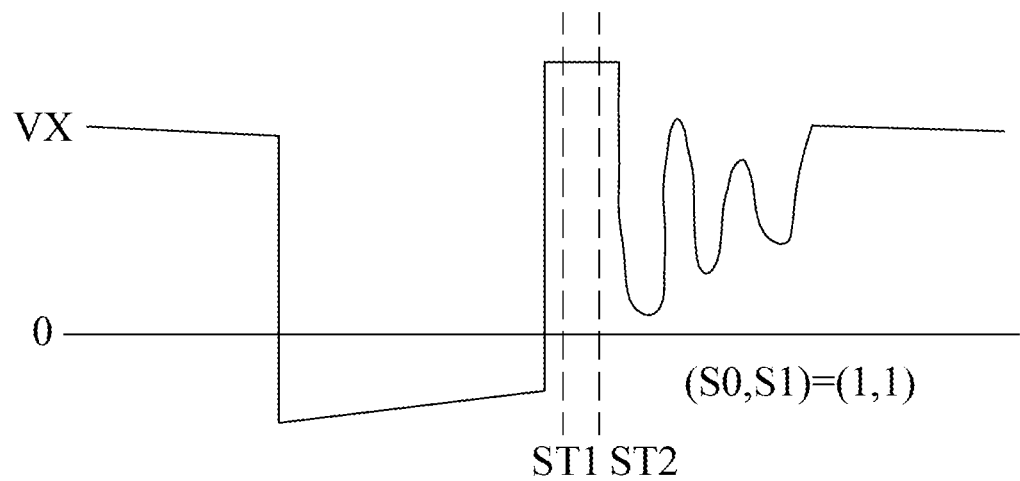
FIG. 7 is a schematic view of a zero current detection signal of a zero current detection system occurring too late, according to the present invention.
Figure 8:
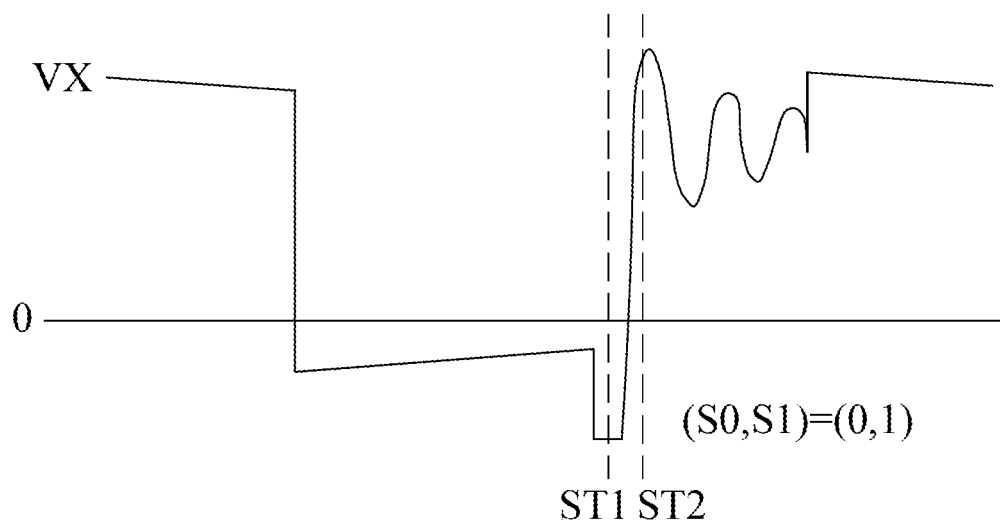
FIG. 8 is a schematic view of a zero current detection signal of a zero current detection system approaching the zero current point, according to the present invention.

When the zero current detection signal 221 is generated later than the real zero current point, the inductor current IL becomes negative already and the inductor current IL flows from the output terminal of the switching regulator 60 to the node X, so the node voltage VX starts to rise to turn on the parasitic diode of the first switch MP1, and the node voltage VX is kept at the high voltage level. When the two sampling voltage logic signals S0 and S1 sampled at the time points ST1 and ST2 are high voltage level, the logic states are (1, 1), it indicates that the zero current detection signal 221 is generated too late, and the delay control module 40 can control the delay line module 30 to reduce the delay time DD1, as shown in FIG. 7.

When the two sampling voltages S0 and S1 are at the low voltage level and the high voltage level, respectively, and their logic states are (0, 1), it indicates that the node voltage VX is still negative when the zero current detection signal 221 is generated, but the node voltage VX is changed to positive later because of occurrence of subharmonic oscillation. Therefore, the time instant of zero current detection signal 221 is very close to real zero current point, and the delay control module 40 can keep the delay time DD1 of the delay line module 30.

In an embodiment, the zero current detection system of the present invention can include an oscillation detector 71 configured to detect whether oscillation occurred on the node voltage VX, and when the oscillation detection result 701 outputted by the oscillation detector 71 indicates the occurrence of oscillation, it determines that the delay control module 40 can reduce the delay time DD1 of the delay line module 30.

In an embodiment, the delay control module 40 can comprise a look-up table 401 which records a corresponding relationship between the two sampling voltages S0 and S1 and adjustment of the delay time DD1, as shown in a table below.

| Oscillation detection result 701 | Sampling voltage S0 | Sampling voltage S1 | Adjustment for the delay time DD1 |
| --- | --- | --- | --- |
| oscillation occurs | 0 | 0 | decrease |
| oscillation occurs | 0 | 1 | decrease |
| oscillation occurs | 1 | 0 | decrease |
| oscillation occurs | 1 | 1 | decrease |
| no oscillation occurs | 0 | 0 | increase |
| no oscillation occurs | 0 | 1 | keep |
| no oscillation occurs | 1 | 0 | decrease |
| no oscillation occurs | 1 | 1 | decrease |

According to the look-up table 401, and the sampling voltages S0 and S1, the delay control module 40 can determine whether to increase, decrease or keep the delay time DD1 of the delay line module 30.

In an embodiment, the parasitic capacitance on the node X may be excessive, and it causes that the node voltage VX does not rise rapidly when the inversing inductor current IL occurs, and the node voltage VX is still below the threshold voltage of the Schmitt trigger at the time point ST2, so that the logic states of the sampling voltages S0 and S1 are (0, 1). In this embodiment, the look-up table can be amended to make the delay control module 40 reduce the delay time DD1 when the logic states of the sampling voltages S0 and S1 are (0, 1).

Figure 9:
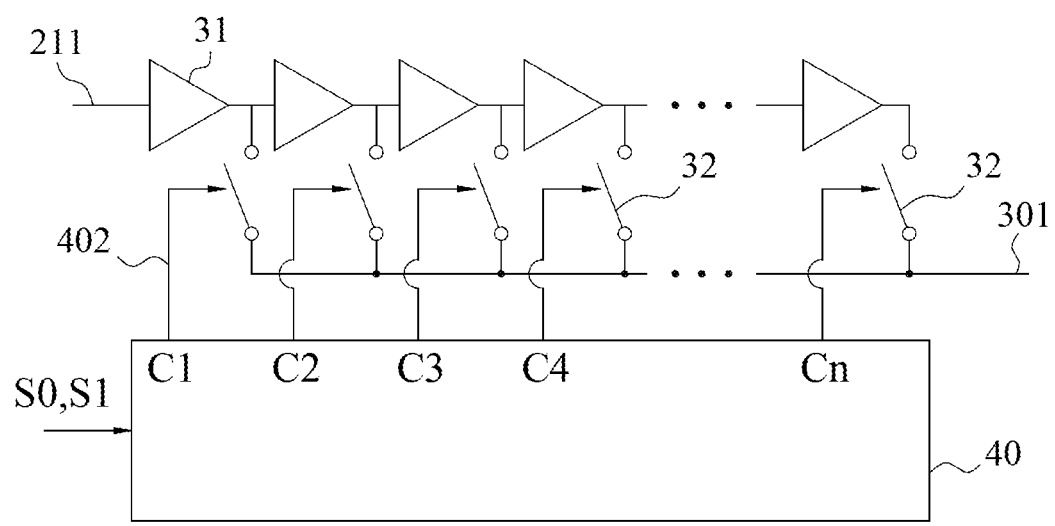
FIG. 9 is a schematic view of an embodiment of a delay line module of a zero current detection system of the present invention.

Please refer to FIG. 9, which shows a schematic view of an embodiment of a delay line module of a zero current detection system of the present invention. As shown in FIG. 9, in an embodiment, the delay line module 30 can comprise a plurality of delay units 31 and a plurality of switches 32, the plurality of delay units 31 are connected in series. Each of the plurality of delay units 31 can delay a delay unit time. Each switch 32 has a terminal electrically connected to the output terminal of the delay line module 30, and the other terminal electrically connected to an output terminal of one of the delay units 31 corresponding thereto. As shown in FIG. 9, the first switch 32 has a terminal electrically connected to the output terminal of the delay line module 30, and other terminal electrically connected to the output terminal of the first delay unit 31; the second switch 32 has a terminal electrically connected to the output terminal of the delay line module 30, and other terminal electrically connected to the output terminal of the second delay unit 31; the third switch 32 has a terminal electrically connected to the output terminal of the delay line module 30, and other terminal electrically connected to the output terminal of the third delay unit 31, and so on.

The delay control module 40 can control the operation state of the plurality of switches 32, to make a specific number of the delay unit 31 delay the first latched output signal 211, so as to adjust the delay time DD1 of the delay line module 30. For example, when the second switch 32 is turned on and other switches 32 are turned off, only the output terminal of the second delay unit 31 is electrically connected the output terminal of the delay line module 30, so that only the first delay unit 31 and the second delay unit 31 can delay the first latched output signal 211 in a sequential order, so that the delay time DD1 of the delay line module 30 is two times of the delay unit time of the delay unit 31. Similarly, when the third switch 32 is turned on, and other switches 32 are turned off, the delay time DD1 of the delay line module 30 is three times of the delay unit time of the delay unit 31. When the fifth switch 32 is turned on, and other switches 32 is turned off, the delay time DD1 of the delay line module 30 is 5 times of the delay unit time of the delay unit 31, and so on. As shown in FIG. 9, when the switch closer to the right side of FIG. 9 is turned on, the delay time DD1 of the delay line module 30 becomes longer. When the switch closer to the left side of FIG. 9 is turned on, the delay time DD1 of the delay line module 30 becomes shorter.

The delay control module 40 can comprise a shift register having a plurality of output terminals C1 to Cn for generating delay control signals 402, so as to control the operation states of the plurality of switches 32. When the delay control module 40 determines to increase the delay time DD1 according to the two sampling voltages S0 and S1 and the look-up table 401, the shift register can turn off the current turned-on switch, and then turn on the switch next to the current turned-on switch, as shown in FIG. 9, the switch 32 disposed on the right side of the current turned-on switch is turned on to increase the delay time DD1. For example, currently, the second switch 32 is turned on, and other switches 32 are turned off, when the delay control module 40 determines to increase the delay time DD1, the output terminal C2 of the shift register can output the delay control signal 402 to turn off the second switch 32, and the output terminal C3 of the shift register can output the delay control signal 402 to turn on the third switch 32.

Similarly, when the delay control module 40 determines to decrease the delay time DD1 according to the two sampling voltages S0 and S1 and the look-up table 401, the shift register can turn off the current turned-on switch and then turn on the switch previous to the current turned-on switch, as shown in FIG. 9, the switch 32 disposed on the left side of the current turned-on switch can be turned on to decrease the delay time DD1. For example, currently, the fourth switch 32 is turned on, and other switches 32 are turned off, and when the delay control module 40 determines to decrease the delay time DD1, the output terminal C4 of the shift register can output the delay control signal 402 to turn off the fourth switch 32, and the output terminal C3 of the shift register can output the delay control signal 402 to turn on the third switch 32.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A zero current detection system, applicable to a switching regulator comprising an inductor, and the inductor having a terminal coupled to an output terminal of the switching regulator, and the zero current detection system comprising:
    a comparator having a positive input coupled to other terminal of the inductor opposite to the output terminal of the switching regulator, and a negative input coupled to a low voltage terminal, and an output terminal configured to output a comparison result signal;
    a first signal latch circuit having a clock terminal configured to receive the comparison result signal, and an output terminal configured to output a latched output signal;
    a delay line module configured to start counting time according to the latched output signal, and output a zero current detection signal after counting a delay time;
    a voltage sampling module configured to sample in response to the zero current detection signal, the node voltage at different time points, to generate two sampling voltages; and
    a delay control module configured to adjust a delay time of the delay line module according to voltage levels of both of the two sampling voltages, wherein when the voltage levels of the two sampling voltages are different, the delay control module keeps the delay time of the delay line module, and when voltage levels of the two sampling voltages are the same, the delay control module adjusts the delay time of the delay line module.

2. The zero current detection system according to claim 1, wherein the delay line module comprises a plurality of delay units and a plurality of switches, the plurality of delay units are connected in series, each of the plurality of switches has an terminal electrically connected to an output terminal of the delay line module, and the other terminal electrically connected to an output terminal of one of the plurality of delay units corresponding thereto, and the delay control module control the plurality of switches to turn on a different number of the delay units, so as to adjust the delay time of the delay line module.

3. The zero current detection system according to claim 2, wherein the delay control module comprises a shift register, the delay control module turns on one of the plurality of switches according to the two sampling voltages, the shift register determines whether to turn off a current turned-on switch and turn on one of the plurality of switches previous to or next to the current turned-on switch.

4. The zero current detection system according to claim 3, wherein when the shift register turns on one of the plurality of switches previous to the current turned-on switch, the delay time of the delay line module is decreased, and when the shift register turns on one of the plurality of switches next to the current turned-on switch, the delay time of the delay line module is increased.

5. The zero current detection system according to claim 1, wherein when the two sampling voltages are at a low voltage level, the delay control module controls the delay line module to increase the delay time, and when the two sampling voltages are at a high voltage level, the delay control module controls the delay line module to decrease the delay time.

6. The zero current detection system according to claim 1, wherein when the first sampling voltage of the two sampling voltages is at a low voltage level, and the second sampling voltage of the two sampling voltages is at a high voltage level, the delay control module keeps the delay time of the delay line module.

7. The zero current detection system according to claim 1, wherein the delay control module comprises a look-up table recording a corresponding relationship between the two sampling voltages and adjustment of the delay time.

8. The zero current detection system according to claim 1, wherein the comparator comprises an offset voltage, and the low voltage terminal is ground, when a sum of the node voltage and the offset voltage is higher than zero voltage, the comparison result signal is changed to a high voltage level.

9. The zero current detection system according to claim 1, wherein the switching regulator comprises a first operation phase, a second operation phase and a third operation phase, and in the first operation phase, an inductor current flowing from the inductor to the output terminal of the switching regulator is increased, in the second operation phase, the inductor current is decreased, the zero current detection signal is used to control the switching regulator to enter the third operation phase.

10. The zero current detection system according to claim 1, wherein the voltage sampling module comprise a trigger, a first delay element, a second delay element, a fourth signal latch circuit and a fifth signal latch circuit, the trigger receives the node voltage, data terminals of the fourth signal latch circuit and the fifth signal latch circuit receive an output signal of the trigger, the first delay element receives an enable signal, the second delay element is electrically connected to an output terminal of the first delay element, clock terminals of the fourth signal latch circuit and the fifth signal latch circuit are electrically connected to output terminals of the first delay element and the second delay element, respectively, the output terminals of the fourth signal latch circuit and the fifth signal latch circuit output the two sampling voltages, respectively.

* * * * *